United States Patent
Dia et al.

(10) Patent No.: US 11,714,125 B2
(45) Date of Patent: Aug. 1, 2023

(54) MULTI-BIT FLIP-FLOP WITH POWER SAVING FEATURE

(71) Applicant: MEDIATEK INC., Hsin-Chu (TW)

(72) Inventors: Kin-Hooi Dia, Hsinchu (TW); Yi-Horng Chiou, Hsinchu (TW)

(73) Assignee: MEDIATEK INC., Hsin-Chu (TW)

( * ) Notice: Subject to any disclaimer, the term of this patent is extended or adjusted under 35 U.S.C. 154(b) by 71 days.

(21) Appl. No.: 17/225,101

(22) Filed: Apr. 7, 2021

(65) Prior Publication Data

US 2021/0359667 A1    Nov. 18, 2021

Related U.S. Application Data

(60) Provisional application No. 63/023,281, filed on May 12, 2020.

(51) Int. Cl.
*G01R 31/317* (2006.01)
*G01R 31/3177* (2006.01)
*G01R 31/3185* (2006.01)
*H03K 3/012* (2006.01)
*H03K 3/037* (2006.01)

(52) U.S. Cl.
CPC ... *G01R 31/31721* (2013.01); *G01R 31/3177* (2013.01); *G01R 31/318541* (2013.01); *H03K 3/012* (2013.01); *H03K 3/037* (2013.01)

(58) Field of Classification Search
CPC .......... G01R 31/31721; G01R 31/3177; G01R 31/318541; G01R 31/318575; H03K 3/012; H03K 3/037

USPC ................................ 714/726, 727, 729, 731
See application file for complete search history.

(56) References Cited

U.S. PATENT DOCUMENTS

| | | | |
|---|---|---|---|
| 7,231,569 B2* | 6/2007 | Chae | G01R 31/318536 714/729 |
| 9,086,458 B2 | 7/2015 | GopalaKrishnaSetty | |
| 9,194,915 B2* | 11/2015 | Bheemanna | G01R 31/318575 |
| 10,033,359 B2* | 7/2018 | Ye | H03K 3/0375 |
| 2004/0111658 A1* | 6/2004 | Natsume | G01R 31/318583 714/752 |
| 2005/0283691 A1* | 12/2005 | Chae | G01R 31/318536 714/726 |

(Continued)

FOREIGN PATENT DOCUMENTS

| | | | | |
|---|---|---|---|---|
| CN | 107395161 A | 11/2017 | | |
| JP | 3420142 | 6/2003 | | |
| WO | WO-0148493 A2 * | 7/2001 | ....... | G01R 31/31721 |

*Primary Examiner* — John J Tabone, Jr.
(74) *Attorney, Agent, or Firm* — Winston Hsu

(57) ABSTRACT

A multi-bit flip-flop (MBFF) has flip-flops connected to form an internal scan chain. One of the flip-flops outputs a first data-out signal at a first data output terminal of the MBFF, and includes a selection circuit, a latch-based circuit, and a data-out stage circuit. The selection circuit transmits a data signal or a test signal to an output node of the selection circuit to serve as an input signal. The latch-based circuit generates a first signal according to the input signal. The data-out stage circuit receives the first signal, and generates the data-out signal according to the first signal. When the MBFF operates in a test mode, the selection circuit transmits the test signal to serve as the input signal, and the data-out stage circuit keeps the data-out signal at a fixed voltage level regardless of a voltage level of the test signal.

17 Claims, 10 Drawing Sheets

(56) References Cited

U.S. PATENT DOCUMENTS

| | | | |
|---|---|---|---|
| 2006/0006900 A1* | 1/2006 | Kinkade | H03K 3/0375 |
| | | | 326/16 |
| 2006/0156116 A1 | 7/2006 | Allen | |
| 2007/0226560 A1 | 9/2007 | Uchida | |
| 2009/0300448 A1* | 12/2009 | Tomita | G01R 31/318541 |
| | | | 714/E11.155 |
| 2011/0181331 A1* | 7/2011 | Srivastava | H03K 3/02332 |
| | | | 716/137 |
| 2015/0039956 A1* | 2/2015 | Goh | G01R 31/318541 |
| | | | 714/729 |
| 2015/0067423 A1* | 3/2015 | GopalaKrishnaSetty | |
| | | | G01R 31/318544 |
| | | | 714/726 |
| 2015/0074477 A1* | 3/2015 | Bheemanna | G01R 31/3177 |
| | | | 714/727 |
| 2016/0124043 A1* | 5/2016 | Datta | G11C 29/32 |
| | | | 714/731 |
| 2018/0375500 A1* | 12/2018 | Hsieh | H03K 3/356104 |
| 2019/0033366 A1* | 1/2019 | Huang | G01R 31/318558 |
| 2021/0325457 A1* | 10/2021 | Wong | G01R 31/3177 |
| 2021/0359667 A1* | 11/2021 | Dia | G01R 31/318541 |

\* cited by examiner

MULTI-BIT FLIP-FLOP WITH POWER SAVING FEATURE

CROSS REFERENCE TO RELATED APPLICATIONS

This application claims the benefit of U.S. provisional application No. 63/023,281, filed on May 12, 2020 and incorporated herein by reference.

BACKGROUND

The present invention relates to a flip-flop design, and more particularly, to a multi-bit flip-flop with a power saving feature which applies a gating function to a data-out signal under a test mode and/or applies a gating function to a scan-out signal under a normal mode.

Scan chains are applied to detect various manufacturing faults in combinatorial logic blocks during test procedures. Generally, a scan chain is composed of several flip-flops which are coupled in series, and a data output terminal of each flip-flop is connected to a combinational logic circuit for normal data transmission in a normal mode. However, in a test mode, the data output terminal of each flip-flop still has data transmission, so the combinational logic circuit still operates, which results in unnecessary power consumption.

SUMMARY

One of the objectives of the claimed invention is to provide a multi-bit flip-flop with a power saving feature which applies a gating function to a data-out signal under a test mode and/or applies a gating function to a scan-out signal under a normal mode.

According to a first aspect of the present invention, an exemplary multi-bit flip-flop (MBFF) is disclosed. The exemplary MBFF includes a plurality of flip-flops connected to form an internal scan chain, wherein the plurality of flip-flops include a first flip-flop arranged to output a first data-out signal at a first data output terminal of the MBFF. The first flip-flop includes a first selection circuit, a first latch-based circuit, and a first data-out stage circuit. The first selection circuit is arranged to transmit a first data signal at a first data input terminal of the MBFF or a first test signal to an output node of the first selection circuit to serve as a first input signal. The first latch-based circuit is coupled to the output node of the first selection circuit, and arranged to generate a first signal according to the first input signal. The first data-out stage circuit is arranged to receive the first signal, and generate the first data-out signal according to the first signal. When the MBFF operates in a test mode, the first selection circuit is arranged to transmit the first test signal to the output node of the first selection circuit to serve as the first input signal, and the first data-out stage circuit is arranged to keep the first data-out signal at a fixed voltage level regardless of a voltage level of the first test signal.

According to a second aspect of the present invention, a control method applied to a multi-bit flip-flop (MBFF) having N flip-flops connected to form an internal scan chain is disclosed. The MBFF has only a single scan input terminal coupled to one of the N flip-flops, and N data output terminals coupled to the N flip-flops, respectively, where N is a positive integer not smaller than one. The control method includes: in response to receiving an external test signal at the single scan input terminal of the MBFF, passing the external test signal through the internal scan chain, generating a scan-out signal with a voltage level that changes in response to a voltage level of the external test signal, wherein the scan-out signal is output from one of the N flip-flops to one of the N data output terminals, and keeping each of (N−1) data-out signals at a fixed voltage level regardless of a voltage level of the external test signal, wherein the (N−1) data-out signals are output from remaining (N−1) flip-flops of the N flip-flops to remaining (N−1) output terminals of the N data output terminals, respectively.

According to a third aspect of the present invention, an exemplary control method applied to a multi-bit flip-flop (MBFF) having N flip-flops connected to form an internal scan chain is disclosed. The MBFF includes only a single scan input terminal coupled to one of the N flip-flops, only a single scan output terminal coupled to another of the N flip-flops, and N data output terminals coupled to the N flip-flops, respectively, where N is a positive integer not smaller than one. The control method includes: in response to receiving an external test signal at the single scan input terminal of the MBFF, passing the external test signal through the internal scan chain, generating a scan-out signal with a voltage level that changes in response to a voltage level of the external test signal, wherein the scan-out signal is output from said another of the N flip-flops to the single scan output terminal, and keeping each of N data-out signals at a fixed voltage level regardless of a voltage level of the external test signal, wherein the N data-out signals are output from the N flip-flops to the N data output terminals of the MBFF, respectively.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the following description and claims, which refer to particular components. As one skilled in the art will appreciate, electronic equipment manufacturers may refer to a component by different names. This document does not intend to distinguish between components that differ in name but not in function. In the following description and in the claims, the terms "include" and "comprise" are used in an open-ended fashion, and thus should be interpreted to mean "include, but not limited to . . . ". Also, the term "couple" is intended to mean either an indirect or direct electrical connection. Accordingly, if one device is coupled to another device, that connection may be through a direct electrical connection, or through an indirect electrical connection via other devices and connections.

Figure 1:
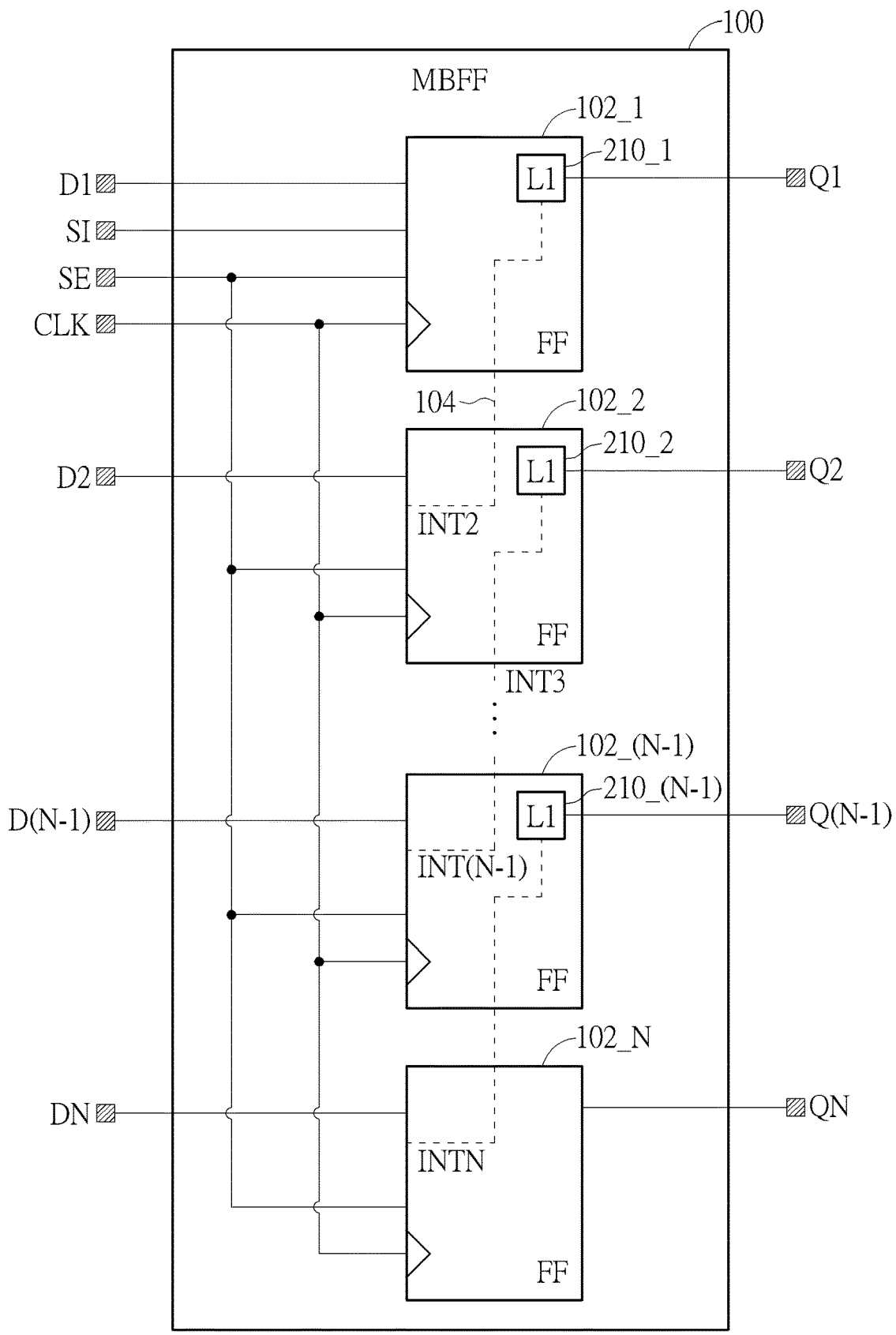
FIG. 1 is a schematic diagram illustrating a first multi-bit flip-flop (MBFF) with a power saving feature according to an embodiment of the present invention.

FIG. 1 is a schematic diagram illustrating a first multi-bit flip-flop (MBFF) with a power saving feature according to an embodiment of the present invention. In this embodiment, the MBFF 100 is an N-bit scan flip-flop, where N is a positive integer not smaller than 1 (i.e., N≥2). A circuit layout of the MBFF 100 may be one cell included in a cell library used by an integrated circuit (IC) design. As shown in FIG. 1, the MBFF 100 has N data input terminals D1, D2, . . . , D(N−1), and DN, only a single scan input terminal SI, a test-enable terminal SE, a clock input terminal CLK, and N data output terminals Q1, Q2, . . . , Q(N−1), and QN. In addition, the MBFF 100 includes N flip-flops (FFs) 102_1, 102_2, . . . , 102_(N−1), and 102_N connected to form an internal scan chain 104, that is, a scan chain formed by internally stitching the flip-flops 102_1-102_N as illustrated by the dashed line. The data input terminals D1-DN are used to receive data signals when the MBFF 100 operates in a normal mode, and are coupled to the flip-flops 102_1-102_N, respectively. The data output terminals Q1-QN are used to output data-out signals when the MBFF 100 operates in the normal mode, and are coupled to the flip-flops 102_1-102_N, respectively. The single scan input terminal SI is used to receive an external test signal, and the external test signal at the single scan input terminal SI passes through the internal scan chain 104, where a test signal of a current flip-flop 102_$n$ (n≠1) is an internal test signal obtained from a preceding flip-flop 102_(n−1). For example, a test signal INT2 of the flip-flop 102_2 is obtained from the flip-flop 102_1, a test signal INT3 of a flip-flop (not shown) is obtained from the flip-flop 102_2, a test signal INT(N−1) of the flip-flop 102_(N−1) is obtained from a flip-flop (not shown), and a test signal INTN of the flip-flop 102_N is obtained from the flip-flop 102_(N−1). Each of the flip-flops 102_1-102_(N−1) has a data-out stage circuit (labeled by "L1") 210_1, 210_2, . . . , 210_(N−1) with a gating function that is enabled in the test mode and disabled in the normal mode.

In a case where that the MBFF 100 operates in the normal mode, the data-out stage circuit 210_1 generates and outputs a data-out signal to the data output terminal Q1, where a voltage level of the data-out signal changes in response to a voltage level of a data signal at the data input terminal D1; the data-out stage circuit 210_2 generates and outputs a data-out signal to the data output terminal Q2, where a voltage level of the data-out signal changes in response to a voltage level of a data signal at the data input terminal D2; and the data-out stage circuit 210_(N−1) generates and outputs a data-out signal to the data output terminal Q(N−1), where a voltage level of the data-out signal changes in response to a voltage level of a data signal at the data input terminal D(N−1). In addition, the data output terminal QN is shared for normal data transmission and test data transmission. Hence, the flip-flop 102_N generates and outputs a data-out signal to the data output terminal QN, where a voltage level of the data-out signal changes in response to a voltage level of a data signal at the data input terminal DN.

In another case where the MBFF 100 operates in the test mode, the data-out stage circuit 210_1 generates and outputs a data-out signal to the data output terminal Q1, where a voltage level of the data-out signal is kept at a fixed voltage level regardless of a voltage level of a test signal at the scan input terminal SI; the data-out stage circuit 210_2 generates and outputs a data-out signal to the data output terminal Q2, where a voltage level of the data-out signal is kept at a fixed voltage level regardless of the test signal INT2 obtained from the flip-flop 102_1; and the data-out stage circuit 210_(N−1) generates and outputs a data-out signal to the data output terminal Q(N−1), where a voltage level of the data-out signal is kept at a fixed voltage level regardless of a voltage level of the test signal INT(N−1) obtained from a preceding flip-flop (not shown). In addition, the data output terminal QN is shared for normal data transmission and test data transmission. Hence, the flip-flop 102_N generates and outputs a scan-out signal to the data output terminal QN, where a voltage level of the scan-out signal changes in response to a voltage level of the test signal INTN (which is derived from passing the external test signal at the scan input terminal SI through the internal scan chain 104).

Figure 2:
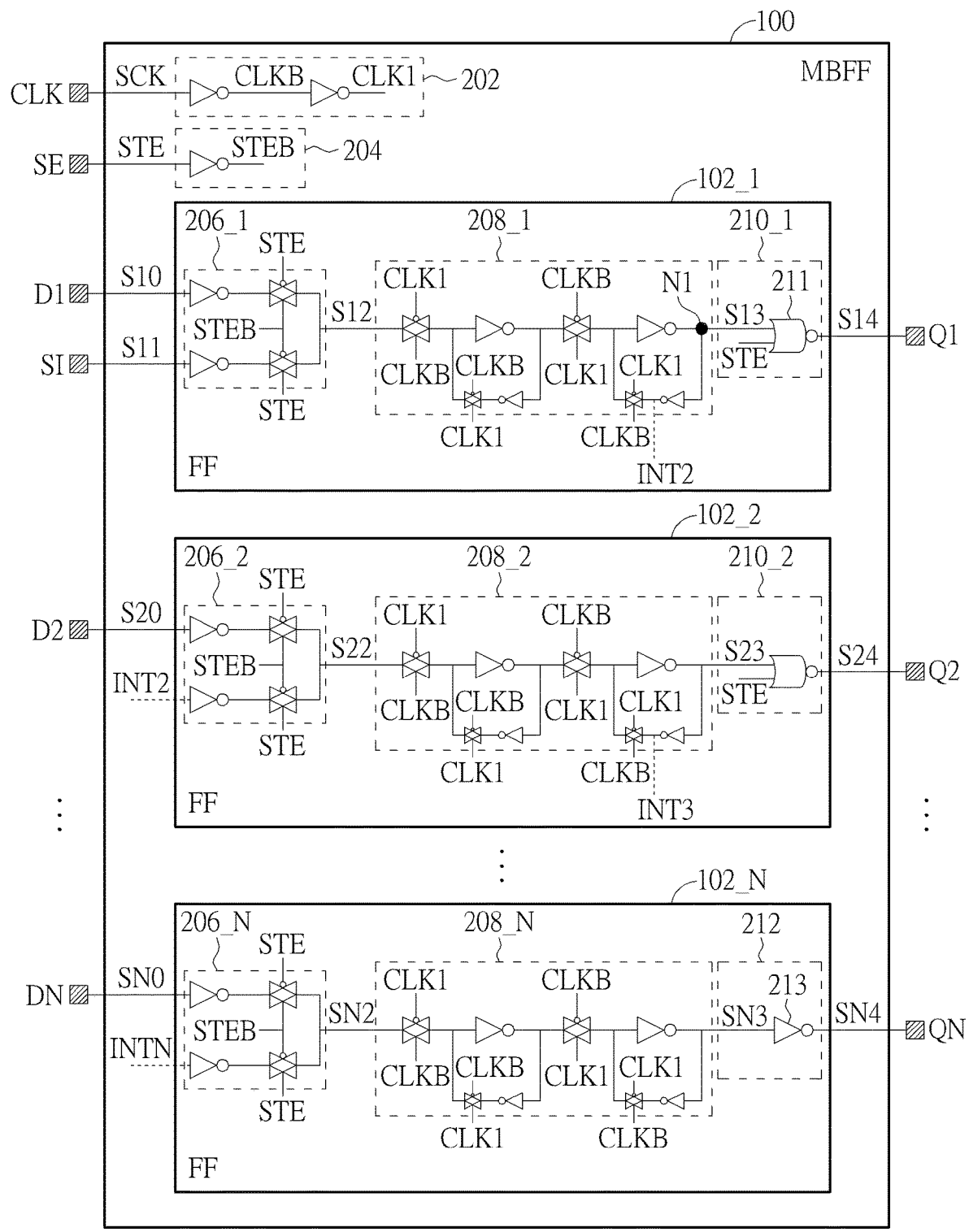
FIG. 2 is a diagram illustrating a first circuit design of an MBFF according to an embodiment of the present invention.

FIG. 2 is a diagram illustrating a first circuit design of an MBFF according to an embodiment of the present invention. By way of example, but not limitation, the MBFF 100 shown in FIG. 1 may be implemented by using the circuit structure shown in FIG. 2. In addition to flip-flops 102_1-102_N, the MBFF 100 may include a signal generation circuit 204 and a clock generation circuit 202. The signal generation circuit 204 receives a test-enable signal STE (which is an external test-enable signal received via the scan-enable terminal SE) to generate another test-enable signal STEB which is the inverse of the test-enable signal STE. In the embodiment of FIG. 2, the signal generation circuit 204 includes an inverter. In other embodiments, the signal generation circuit 204 may be implemented by any other circuit structure which is capable of receiving the test-enable signal STE and generating the test-enable signal STEB which is the inverse of the test-enable signal STE.

The clock generation circuit 110 receives a clock signal SCK (which is an external clock signal received via the clock terminal CK), and generates clock signals CLKB and CLK1 according to the clock signal SCK, where the clock signal CLKB is the inverse of the clock signal SCK, and the clock signal CLK1 is the inverse of the clock signal CLKB. In the embodiment of FIG. 2, the clock generation circuit 202 includes two inverters. In other embodiments, the clock generation circuit 202 may be implemented by any other circuit structure which is capable of receiving the clock signal SCK, generating the clock signal CLKB which is the inverse of the clock signal SCK, and generating the clock signal CLK1 which is the inverse of the clock signal CLKB.

Each of the flip-flops 102_1-102_(N−1) may have the same circuit structure. For example, the flip-flop 102_1 is arranged to output a data-out signal S14 at the data output terminal Q1 of the MBFF 100, and includes a selection circuit 206_1, a latch-based circuit 208_1, and a data-out stage circuit 210_1; and the flip-flop 102_2 is arranged to output a data-out signal S24 at the data output terminal Q2 of the MBFF 100, and includes a selection circuit 206_2, a latch-based circuit 208_2, and a data-out stage circuit 210_2. Regarding the flip-flop 102_1, the selection circuit 206_1 is arranged to transmit a data signal S10 at the data input terminal D1 of the MBFF 100 or a test signal S11 at the scan input terminal SI of the MBFF 100 to an output node of the selection circuit 206_1 to serve as an input signal S12; the latch-based circuit 208_1 is coupled to the output node of the selection circuit 206_1 and arranged to generate a signal S13 according to the input signal S12; and the data-out stage circuit 210_1 is arranged to receive the signal S13, and generate the data-out signal S14 according to the signal S13. In this embodiment, the selection circuit 206_1 may include inverters and transmission gates, where each of the transmission gates consists of a P-type transistor (e.g., P-channel metal-oxide semiconductor (PMOS) transistor) and an N-type transistor (e.g., N-channel metal-oxide semiconductor (NMOS) transistor), and is controlled by test-enable signals STE and STEB. In addition, the latch-based circuit 208_1 may include inverters and transmission gates, where each of the transmission gates consists of a P-type transistor (e.g., PMOS transistor) and an N-type transistor (e.g., NMOS transistor), and is controlled by clock signals CLK1 and CLKB. Since the present invention does not focus on circuit designs of the selection circuit 206_1 and the latch-based circuit 208_1, and a skilled person should readily understand principles of the selection circuit 206_1 and the latch-based circuit 208_1 illustrated in FIG. 2, further description is omitted here for brevity.

The data-out stage circuit 210_1 is equipped with a gating function that is enabled in the test mode of the MBFF 100 and disabled in the normal mode of the MBFF 100. For example, when the MBFF 100 operates in the normal mode, the selection circuit 206_1 transmits the data signal S10 to the output node of the selection circuit 206_1 to serve as the input signal S12, and the data-out stage circuit 210_1 generates the data-out signal S14 having a voltage level that changes in response to a voltage level of the data signal S10. Specifically, the voltage level of the data-out signal S14 changes in response to the voltage level of the signal S13, where the voltage level of the signal S13 changes in response to the voltage level of the data signal S10. When the MBFF 100 operates in the test mode, the selection circuit 206_1 transmits the test signal S11 to the output node of the selection circuit 206_1 to serve as the input signal S12, and the data-out stage circuit 210_1 keeps the data-out signal S14 at a fixed voltage level (e.g., high voltage level or low voltage level) regardless of a voltage level of the test signal S11. Specifically, the voltage level of the data-out signal S14 does not change in response to the voltage level of the signal S13, while the voltage level of the signal S13 changes in response to the voltage level of the test signal S11.

In contrast to the first flip-flop 102_1 that receives the test signal S11 via the scan input terminal SI, the following flip-flop 102_2 receives the test signal INT2 that is obtained from the preceding flip-flop 102_1 (particularly, latch-based circuit 208_1 of flip-flop 102_1). Regarding the flip-flop 102_2, the selection circuit 206_2 is arranged to transmit a data signal S20 at the data input terminal D2 of the MBFF 100 or the test signal INT2 obtained from the latch-based circuit 208_1 to an output node of the selection circuit 206_2 to serve as an input signal S22; the latch-based circuit 208_2 is coupled to the output node of the selection circuit 206_2 and arranged to generate a signal S23 according to the input signal S22; and the data-out stage circuit 210_2 is arranged to receive the signal S23, and generate the data-out signal S24 according to the signal S23. Similarly, the data-out stage circuit 210_2 is equipped with same gating function that is enabled in the test mode of the MBFF 100 and disabled in the normal mode of the MBFF 100.

The last flip-flop 102_N is arranged to generate an output signal SN4 at the data output terminal QN of the MBFF 100, and includes a selection circuit 206_N, a latch-based circuit 208_N, and an output stage circuit 212. The output stage circuit 212 is implemented by using an inverter 213. The selection circuit 206_N is arranged to transmit a data signal SN0 at the data input terminal DN of the MBFF 100 or the test signal INTN obtained from a preceding flip-flop to an output node of the selection circuit 206_N to serve as an input signal SN2. The latch-based circuit 208_N is coupled to the output node of the selection circuit 206_N and arranged to generate a signal SN3 according to the input signal SN2. The output stage circuit 212 is arranged to receive the signal SN3, and generate the output signal SN4 according to the signal SN3. In this embodiment, the data output terminal QN is shared for normal data transmission and test data transmission. When the MBFF 100 operates in the normal mode, the selection circuit 206_N transmits the data signal SN0 to the output node of the selection circuit 206_N to serve as the input signal SN2, and the output stage circuit 212 generates the output signal SN4 as a data-out signal having a voltage level that changes in response to a voltage level of the data signal SN0. Specifically, the voltage level of the output signal SN4 (data-out signal) changes in response to the voltage level of the signal SN3, where the voltage level of the signal SN3 changes in response to the voltage level of the data signal SN0. When the MBFF 100 operates in the test mode, the selection circuit 206_N transmits the test signal INTN to the output node of the selection circuit 206_N to serve as the input signal SN2, and the output stage circuit 212 generates the output signal SN4 as a scan-out signal having a voltage level that changes in response to a voltage level of the test signal INTN. Specifically, the voltage level of the output signal SN4 (scan-out signal) changes in response to the voltage level of the signal SN3, where the voltage level of the signal SN3 changes in response to the voltage level of the test signal INTN.

In this embodiment, each data-out stage circuit with a gating function may be implemented by using a NOR gate 211, where one input node of the NOR gate 211 is arranged to receive an output signal of a preceding latch-based circuit, another input node of the NOR gate 211 is arranged to receive the test-enable signal STE, and an output node of the NOR gate 211 is arranged to output a data-out signal to a data output terminal of the MBFF 100. Taking the data-out stage 210_1 for example, one input node of the NOR gate 211 receives the signal S13 at an output node N1 of the latch-based circuit 208_1, another input node of the NOR gate 211 receives the test-enable signal STE, and an output node of the NOR gate 211 outputs the data-out signal S14 to the data output terminal Q1 of the MBFF 100. When the MBFF 100 operates in the normal mode (STE=0), the voltage level of the data-out signal S14 changes in response to the voltage level of the signal S13. Specifically, the data-out signal S14 is the inverse of the signal S13, where the signal S13 is the inverse of the data signal S10. When the MBFF 100 operates in the test mode (STE=1), the voltage level of the data-out signal S14 is maintained at a fixed voltage level (e.g., ground voltage) regardless of the voltage level of the test signal S11. Specifically, the voltage level of the data-out signal S14 does not change in response to the voltage level of the signal S13, where the signal S13 is the inverse of the test signal S11.

The circuit structure shown in FIG. 2 is for illustrative purposes only, and is not meant to be a limitation of the present invention. For example, the selection circuit may be implemented by any other circuit structure which is capable of selecting one of a normal data input and a test data input as an input signal of a following latch-based circuit. For another example, the latch-based circuit may be implemented by any other circuit structure which is capable of processing an input signal obtained from a preceding selection circuit to generate and output a signal to a following data-out stage circuit with a gating function. For yet another example, the data-out stage circuit with a gating function may be implemented by any other circuit structure which is capable of keeping a data-out signal at a fixed voltage level when an MBFF operates in a test mode.

Figure 3:
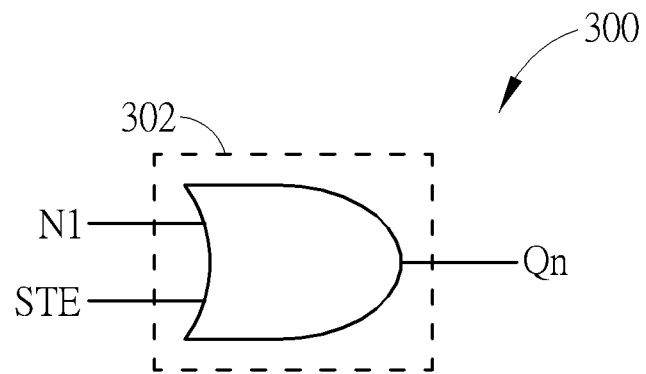
FIG. 3 is a diagram illustrating a first alternative design of a data-out stage circuit with a gating function according to an embodiment of the present invention.

FIG. 3 is a diagram illustrating a first alternative design of a data-out stage circuit with a gating function according to an embodiment of the present invention. For example, one or more of the data-out stage circuits 210_1-210_(N−1) may be implemented by using the data-out stage circuit 300. The data-out stage circuit 300 employs an OR gate 302, where one input node of the OR gate 302 is coupled to an output node N1 of a preceding latch-based circuit, another input node of the OR gate 302 is arranged to receive the test-enable signal STE, and an output node of the OR gate 302 is arranged to output a data-out signal to a data output terminal Qn of the MBFF 100, where n is a positive integer selected from a range of 1 to (N−1). When the MBFF 100 operates in the normal mode (STE=0), a voltage level of the data-out signal generated from the OR gate 302 changes in response to a voltage of a signal at the output node N1 of the preceding latch-based circuit. When the MBFF 100 operates in the test mode (STE=1), the data-out signal generated from the OR gate 302 is kept at a fixed voltage level (e.g., power supply voltage) regardless of the voltage of the signal at the output node N1 of the preceding latch-based circuit.

Figure 4:
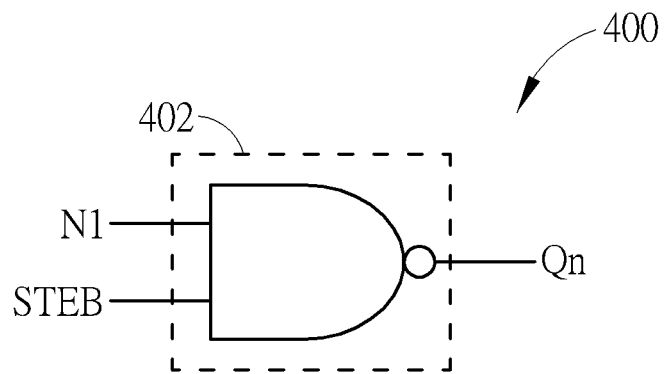
FIG. 4 is a diagram illustrating a second alternative design of a data-out stage circuit with a gating function according to an embodiment of the present invention.

FIG. 4 is a diagram illustrating a second alternative design of a data-out stage circuit with a gating function according to an embodiment of the present invention. For example, one or more of the data-out stage circuits 210_1-210_(N−1) may be implemented by using the data-out stage circuit 400. The data-out stage circuit 400 employs a NAND gate 302, where one input node of the NAND 402 is coupled to an output node N1 of a preceding latch-based circuit, another input node of the NAND gate 402 is arranged to receive the test-enable signal STEB, and an output node of the NAND gate 402 is arranged to output a data-out signal to a data output terminal Qn of the MBFF 100, where n is a positive integer selected from a range of 1 to (N−1). When the MBFF 100 operates in the normal mode (STEB=1), a voltage level of the data-out signal generated from the NAND gate 402 changes in response to a voltage of a signal at the output node N1 of the preceding latch-based circuit. When the MBFF 100 operates in the test mode (STEB=0), the data-out signal generated from the NAND gate 402 is kept at a fixed voltage level (e.g., power supply voltage) regardless of the voltage of the signal at the output node N1 of the preceding latch-based circuit.

Figure 5:
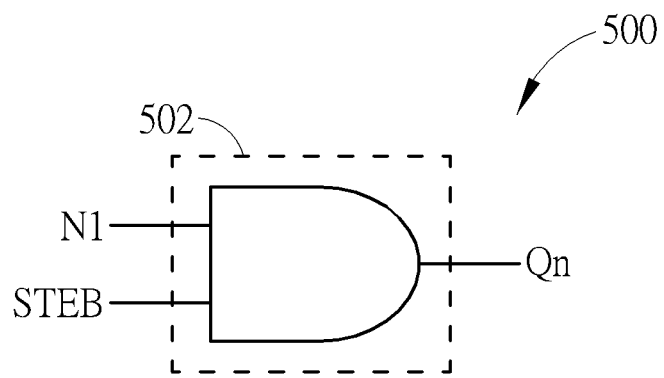
FIG. 5 is a diagram illustrating a third alternative design of a data-out stage circuit with a gating function according to an embodiment of the present invention.

FIG. 5 is a diagram illustrating a third alternative design of a data-out stage circuit with a gating function according to an embodiment of the present invention. For example, one or more of the data-out stage circuits 210_1-210_(N−1) may be implemented by using the data-out stage circuit 500. The data-out stage circuit 500 employs an AND gate 502, where one input node of the AND 502 is coupled to an output node N1 of a preceding latch-based circuit, another input node of the AND gate 502 is arranged to receive the test-enable signal STEB, and an output node of the AND gate 502 is arranged to output a data-out signal to a data output terminal Qn of the MBFF 100, where n is a positive integer selected from a range of 1 to (N−1). When the MBFF 100 operates in the normal mode (STEB=1), a voltage level of the data-out signal generated from the AND gate 502 changes in response to a voltage of a signal at the output node N1 of the preceding latch-based circuit. When the MBFF 100 operates in the test mode (STEB=0), the data-out signal generated from the OR gate 302 is kept at a fixed voltage level (e.g., ground voltage) regardless of the voltage of the signal at the output node N1 of the preceding latch-based circuit.

Figure 6:
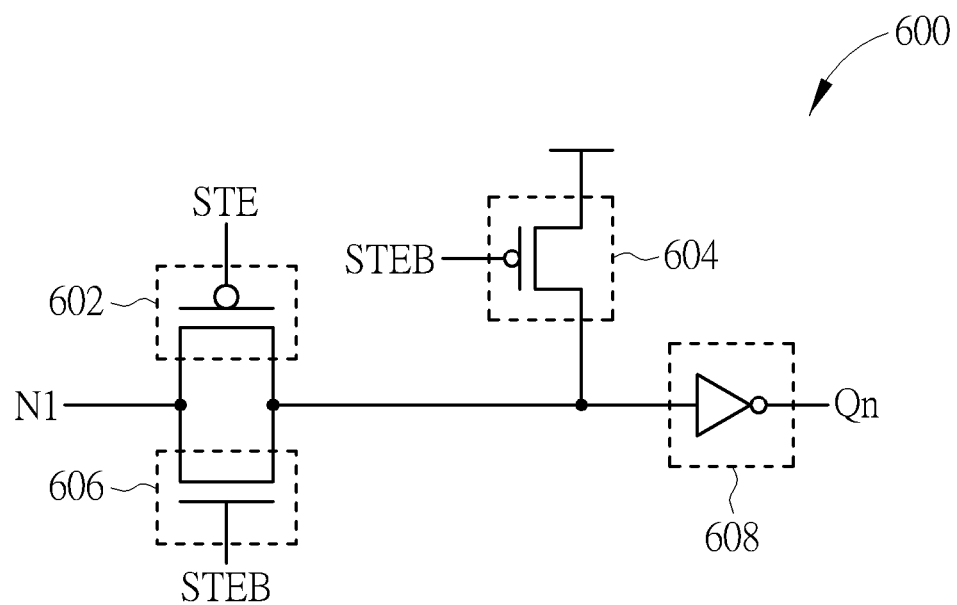
FIG. 6 is a diagram illustrating a fourth alternative design of a data-out stage circuit with a gating function according to an embodiment of the present invention.

FIG. 6 is a diagram illustrating a fourth alternative design of a data-out stage circuit with a gating function according to an embodiment of the present invention. For example, one or more of the data-out stage circuits 210_1-210_(N−1) may be implemented by using the data-out stage circuit 600. The data-out stage circuit 600 includes PMOS transistors 602 and 604, an NMOS transistor 606, and an inverter 608. The gate electrode of the PMOS transistor 604 receives the test-enable signal STEB, the source electrode of the PMOS transistor 604 is coupled to a reference voltage (e.g., power supply voltage), and the drain electrode of the PMOS transistor 604 is coupled to an input node of the inverter 608. The PMOS transistor 602 and the NMOS transistor 606 form a transmission gate. The gate electrode of the PMOS transistor 602 receives the test-enable signal STE, the source electrode of the PMOS transistor 602 is coupled to an output node N1 of a preceding latch-based circuit, and the drain electrode of the PMOS transistor 602 is coupled to the input node of the inverter 608. The gate electrode of the NMOS transistor 606 receives the test-enable signal STEB, the drain electrode of the NMOS transistor 606 is coupled to the output node N1 of the preceding latch-based circuit, and the source electrode of the NMOS transistor 606 is coupled to the input node of the inverter 608.

When the MBFF 100 operates in the normal mode (STE=0 & STEB=1), the transmission gate consisting of PMOS transistor 602 and NMOS transistor 606 is enabled, and the PMOS transistor 604 is turned off, such that the voltage level of the data-out signal at a data output terminal Qn (n is a positive integer selected from a range of 1 to (N−1)) changes in response to the voltage level of the signal at the output node N1 of the preceding latch-based circuit. When the MBFF 100 operates in the test mode (STE=1 & STEB=0), the transmission gate consisting of PMOS transistor 602 and NMOS transistor 606 is disabled, and the PMOS transistor 604 is turned on, such that the voltage level of the data-out signal at the data output terminal Qn is maintained at a fixed voltage level (e.g., ground voltage)

regardless of the voltage level of the signal at the output node N1 of the preceding latch-based circuit.

Figure 7:
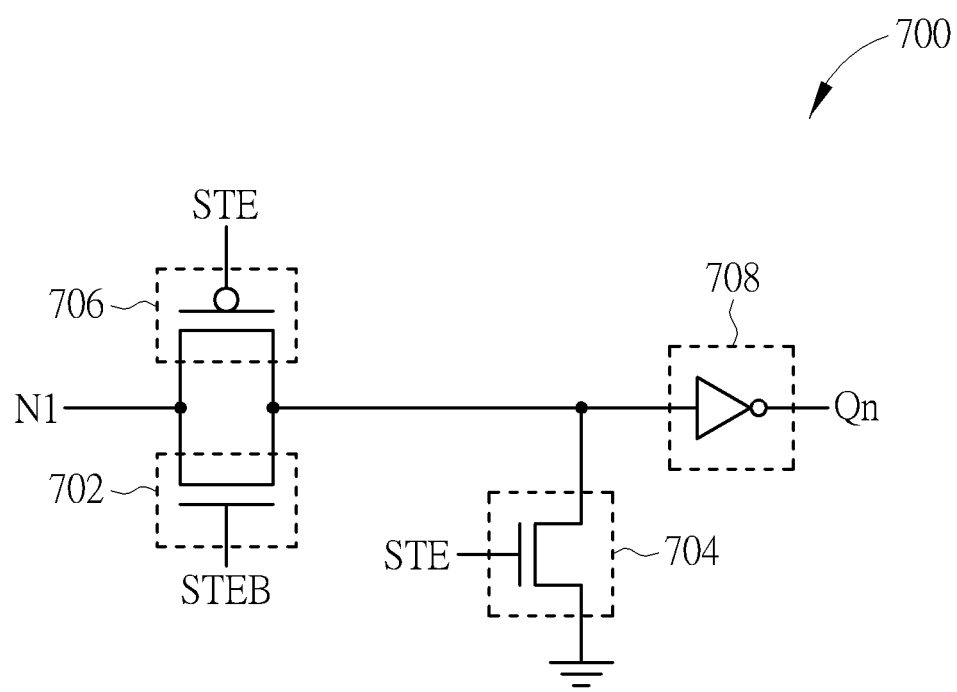
FIG. 7 is a diagram illustrating a fifth alternative design of a data-out stage circuit with a gating function according to an embodiment of the present invention.

FIG. 7 is a diagram illustrating a fifth alternative design of a data-out stage circuit with a gating function according to an embodiment of the present invention. For example, one or more of the data-out stage circuits 210_1-210_(N−1) may be implemented by using the data-out stage circuit 700. The data-out stage circuit 700 includes NMOS transistors 702 and 704, a PMOS transistor 706, and an inverter 708. The gate electrode of the NMOS transistor 704 receives the test-enable signal STE, the source electrode of the NMOS transistor 704 is coupled to a reference voltage (e.g., ground voltage), and the drain electrode of the NMOS transistor 704 is coupled to an input node of the inverter 708. The PMOS transistor 706 and the NMOS transistor 702 form a transmission gate. The gate electrode of the PMOS transistor 706 receives the test-enable signal STE, the source electrode of the PMOS transistor 706 is coupled to an output node N1 of a preceding latch-based circuit, and the drain electrode of the PMOS transistor 706 is coupled to the input node of the inverter 708. The gate electrode of the NMOS transistor 702 receives the test-enable signal STEB, the drain electrode of the NMOS transistor 702 is coupled to the output node N1 of the preceding latch-based circuit, and the source electrode of the NMOS transistor 702 is coupled to the input node of the inverter 708.

When the MBFF 100 operates in the normal mode (STE=0 & STEB=1), the transmission gate consisting of PMOS transistor 706 and NMOS transistor 702 is enabled, and the NMOS transistor 704 is turned off, such that the voltage level of the data-out signal at a data output terminal Qn (n is a positive integer selected from a range of 1 to (N−1)) changes in response to the voltage level of the signal at the output node N1 of the preceding latch-based circuit. When the MBFF 100 operates in the test mode (STE=1 & STEB=0), the transmission gate consisting of PMOS transistor 706 and NMOS transistor 702 is disabled, and the NMOS transistor 704 is turned on, such that the voltage level of the data-out signal at the data output terminal Qn is maintained at a fixed voltage level (e.g., power supply voltage) regardless of the voltage level of the signal at the output node N1 of the preceding latch-based circuit.

The MBFF 100 with N flip-flops 102_1-102_N connected to form the internal scan chain 104 is designed to have a power saving feature. For example, when receiving the external test signal S11 at the scan input terminal SI under the test mode, the MBFF 100 passes the external test signal S11 through the internal scan chain 104, generates a scan-out signal SN4 that is output from the flip-flop 102_N to the data output terminal QN and a voltage level thereof changes in response to a voltage level of the external test signal S11, and keeps each of (N−1) data-out signals (which are output from (N−1) flip-flops 102_1-102_(N−1) to (N−1) output terminals Q1-Q(N−1), respectively) at a fixed voltage level regardless of the voltage level of the external test signal S11. Since (N−1) data-out signals have no signal level transition under the test mode of the MBFF 100, the power consumption of the MBFF 100 and the downstream combinational logics can be reduced.

In the embodiments shown in FIG. 1 and FIG. 2, the MBFF 100 has the data output terminal QN shared for normal data transmission and test data transmission. However, this is for illustrative purposes only, and is not meant to be a limitation of the present invention. In an alternative design, an MBFF may be configured to have an additional terminal acting as a dedicated scan output terminal for outputting a scan-out signal.

Figure 8:
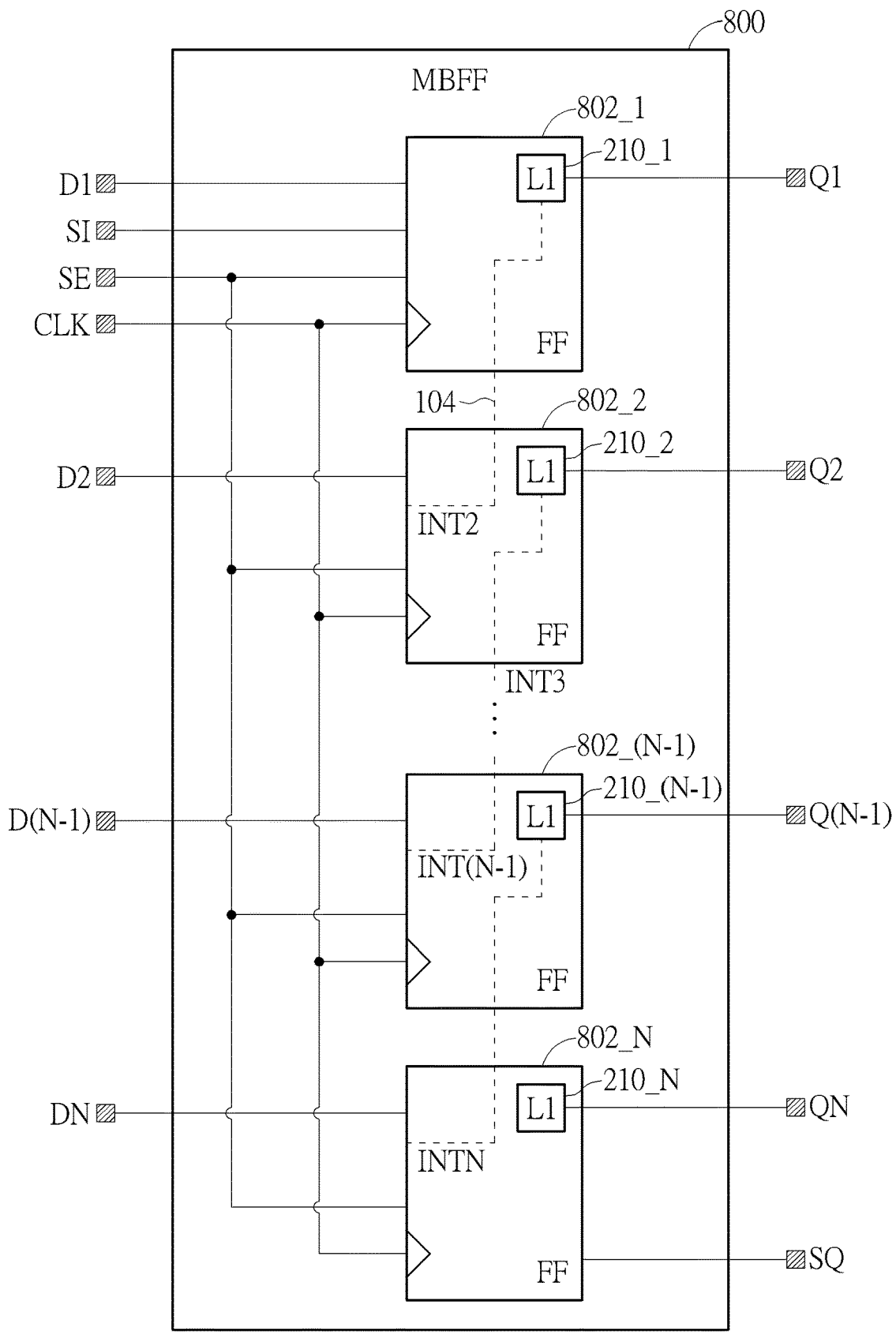
FIG. 8 is a schematic diagram illustrating a second MBFF with a power saving feature according to an embodiment of the present invention.

FIG. 8 is a schematic diagram illustrating a second MBFF with a power saving feature according to an embodiment of the present invention. In this embodiment, the MBFF 800 is an N-bit scan flip-flop, where N is a positive integer not smaller than 1 (i.e., N≥2). A circuit layout of the MBFF 800 may be one cell included in a cell library used by an IC design. As shown in FIG. 8, the MBFF 800 has N data input terminals D1, D2, . . . , D(N−1), and DN, only a single scan input terminal SI, a test-enable terminal SE, a clock input terminal CLK, N data output terminals Q1, Q2, . . . , Q(N−1), and QN, and a scan output terminal SQ. In addition, the MBFF 800 includes N flip-flops (FFs) 802_1, 802_2, . . . , 802_(N−1), and 802_N connected to form the internal scan chain 104. The major difference between the MBFFs 100 and 800 is that the flip-flop 802_N of the MBFF 800 has the scan output terminal SQ used to output a scan-out signal when the MBFF 800 operates in the test mode, and further has a data-out stage circuit (labeled by "L1") 210_N with a gating function that is enabled in the test mode and disabled in the normal mode.

In a case where that the MBFF 800 operates in the normal mode, the data-out stage circuit 210_N generates and outputs a data-out signal to the data output terminal QN, where a voltage level of the data-out signal changes in response to a voltage level of a data signal at the data input terminal DN. In another case where the MBFF 800 operates in the test mode, a scan-out stage circuit (not shown) generates and outputs a scan-out signal to the scan output terminal SQ, where a voltage level of the scan-out signal changes in response to a voltage level of a data signal at the data input terminal DN. Furthermore, the data-out stage circuit 210_N generates and outputs a data-out signal to the data output terminal QN, where a voltage level of the data-out signal is kept at a fixed voltage level (e.g., high voltage level or low voltage level) regardless of a voltage level of a test signal INTN obtained from the preceding flip-flop 802_(N−1).

Figure 9:
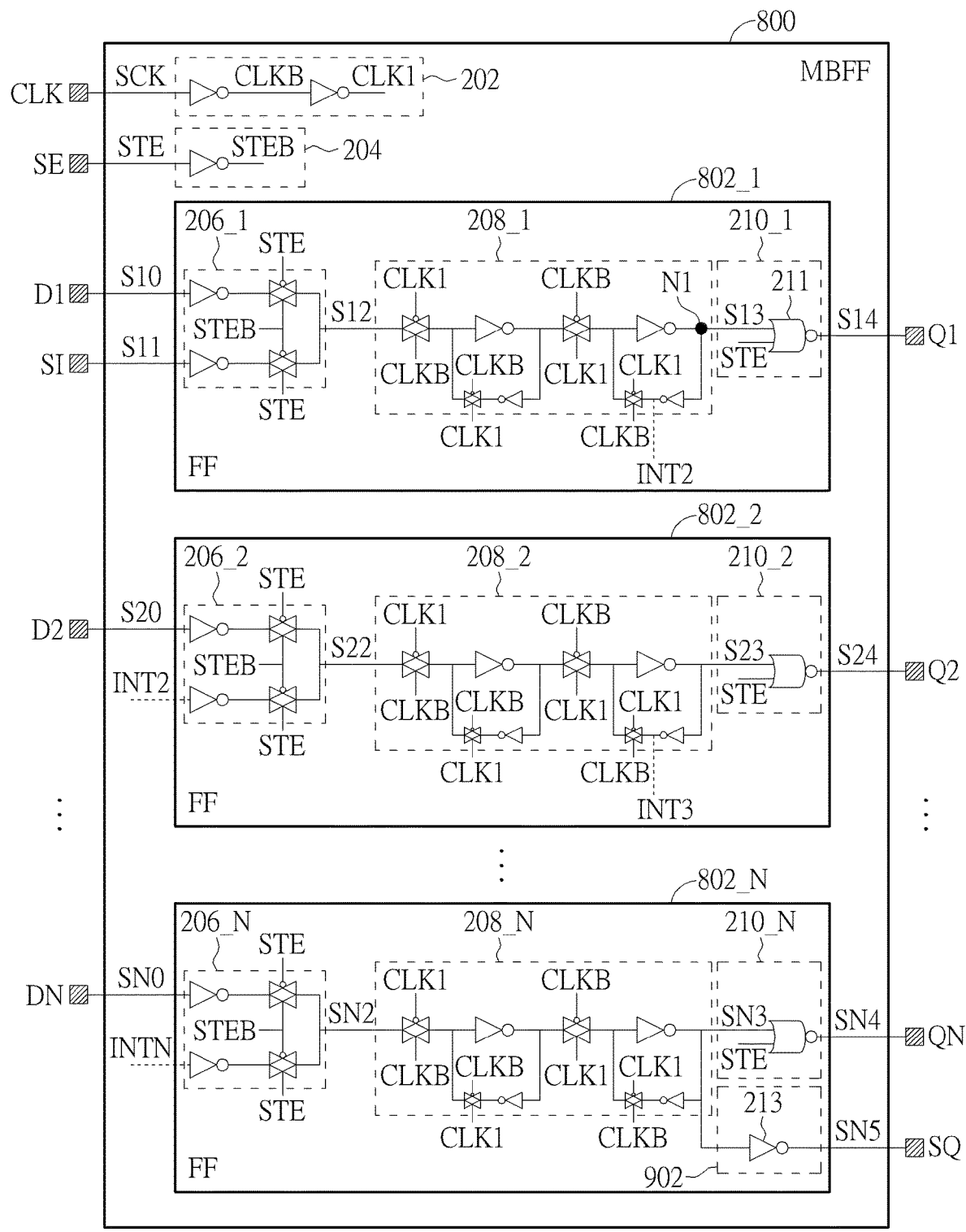
FIG. 9 is a diagram illustrating a second circuit design of an MBFF according to an embodiment of the present invention.

FIG. 9 is a diagram illustrating a second circuit design of an MBFF according to an embodiment of the present invention. By way of example, but not limitation, the MBFF 800 shown in FIG. 8 may be implemented using the circuit structure shown in FIG. 9. Each of the flip-flops 802_1-802_(N−1) may have the same circuit structure as illustrated in FIG. 2. Similar description is omitted for brevity. Regarding the last flip-flop 802_N, it is arranged to output a data-out signal SN4 at the data output terminal QN of the MBFF 800, and output a scan-out signal SN5 at the scan output terminal SQ of the MBFF 800. As shown in FIG. 9, the flip-flop 802_N includes a data-out stage circuit 210_N, a scan-out stage circuit 902, and the aforementioned selection circuit 206_N and latch-based circuit 208_N. Like the output stage circuit 212 shown in FIG. 2, the scan-out stage circuit 902 is implemented by the inverter 213. Like the data-out stage circuits 210_1 and 210_2, the data-out stage circuit 210_N is equipped with a gating function that is enabled in a test mode of the MBFF 800 and disabled in a normal mode of the MBFF 800. When the MBFF 800 operates in the normal mode, the selection circuit 206_N transmits the data signal SN0 to the output node of the selection circuit 206_N to serve as the input signal SN2, and the data-out stage circuit 210_N generates the data-out signal SN4 having a voltage level that changes in response to a voltage level of the data signal SN0. Specifically, the voltage level of the data-out signal SN4 changes in response to the voltage level of the signal SN3, where the voltage level of the signal SN3 changes in response to the voltage level of the data signal SN0. When the MBFF 800 operates in the test mode, the selection circuit 206_N transmits the test signal INTN to the output node of the selection circuit 206_N to serve as the input signal SN2, and the data-out stage circuit 210_N keeps the data-out signal SN4 at a fixed voltage level (e.g., high voltage level or low voltage level) regardless of a voltage level of the test signal INTN. Specifically, the voltage level of the data-out signal SN4 does not change in response to the voltage level of the signal SN3, while the voltage level of the signal SN3 changes in response to the voltage level of the test signal INTN.

The circuit structure shown in FIG. 9 is for illustrative purposes only, and is not meant to be a limitation of the present invention. For example, the selection circuit may be implemented by any other circuit structure which is capable of selecting one of a normal data input and a test data input as an input signal of a following latch-based circuit. For another example, the latch-based circuit may be implemented by any other circuit structure which is capable of processing an input signal obtained from a preceding selection circuit to generate and output a signal to a following data-out stage circuit with a gating function. For still another example, the data-out stage circuit with a gating function may be implemented by any other circuit structure which is capable of keeping a data-out signal at a fixed voltage level when an MBFF operates in a test mode. Hence, one or more of the flip-flops 802_1-802_N may be implemented by using the data-out stage circuit 300 shown in FIG. 3, the data-out stage circuit 400 shown in FIG. 4, the data-out stage circuit 500 shown in FIG. 5, the data-out stage circuit 600 shown in FIG. 6, or the data-out stage circuit 700 shown in FIG. 7.

The MBFF 800 with N flip-flops 802_1-802_N connected to form the internal scan chain 104 is designed to have a power saving feature. For example, when receiving an external test signal S11 at the scan input terminal SI, the MBFF 800 passes the external test signal S11 through the internal scan chain 104, generates a scan-out signal SN4 that is output from the flip-flop 802_N to the scan output terminal SQ and a voltage level thereof changes in response to a voltage level of the external test signal S11, and keeps each of N data-out signals (which are output from N flip-flops 802_1-802_N to N output terminals Q1-QN, respectively) at a fixed voltage level regardless of a voltage level of the external test signal S11. Since N data-out signals have no signal level transition under the test mode of the MBFF 800, the power consumption of the MBFF 800 and the downstream combinational logics can be reduced.

In the embodiment shown in FIG. 9, the scan-out stage circuit 902 does not have a gating function. As a result, when the MBFF 800 operates in any of the normal mode and the test mode, the voltage level of the scan-out signal SN5 changes in response to the voltage level of the signal SN3. In an alternative design, an MBFF may be configured to have a scan-out stage circuit with a gating function.

Figure 10:
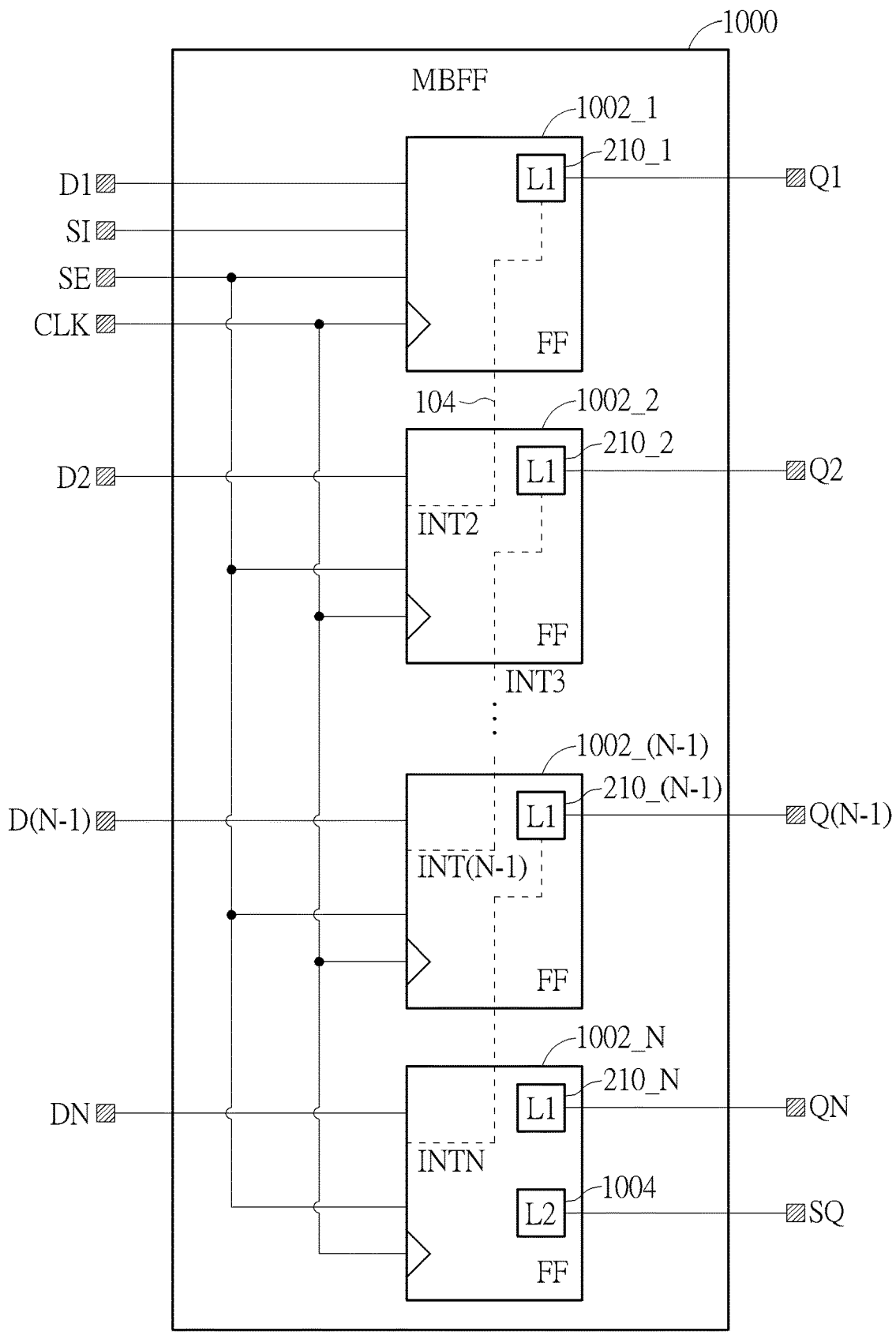
FIG. 10 is a schematic diagram illustrating a third MBFF with a power saving feature according to an embodiment of the present invention.

FIG. 10 is a schematic diagram illustrating a third MBFF with a power saving feature according to an embodiment of the present invention. In this embodiment, the MBFF 1000 is an N-bit scan flip-flop, where N is a positive integer not smaller than 1 (i.e., N≥2). A circuit layout of the MBFF 1000 may be one cell included in a cell library used by an IC design. As shown in FIG. 10, the MBFF 1000 has N data input terminals D1, D2, . . . , D(N-1), and DN, only a single scan input terminal SI, a test-enable terminal SE, a clock input terminal CLK, N data output terminals Q1, Q2, . . . , Q(N-1), and QN, and a scan output terminal SQ. In addition, the MBFF 1000 includes N flip-flops (FFs) 1002_1, 1002_2, . . . , 1002_(N-1), 1002_N connected to form the internal scan chain 104. The major difference between the MBFFs 1000 and 800 is that the last flip-flop 1002_N of the MBFF 1000 has a scan-out stage circuit (labeled by "L2") 1004 with a gating function that is enabled in the normal mode and disabled in the test mode.

Ina case where that the MBFF 1000 operates in the normal mode, the data-out stage circuit 210_N generates and outputs a data-out signal to the data output terminal QN, where a voltage level of the data-out signal changes in response to a voltage level of a data signal at the data input terminal DN; and the scan-out stage circuit 1004 generates and outputs a scan-out signal to the scan output terminal SQ, where a voltage level of the scan-out signal is kept at a fixed voltage level (e.g., high voltage level or low voltage level) regardless of a voltage level of the data signal at the data input terminal DN.

In another case where the MBFF 1000 operates in the test mode, the scan-out stage circuit 1004 generates and outputs the scan-out signal to the scan output terminal SQ, where a voltage level of the scan-out signal changes in response to a voltage level of a test signal INTN obtained from the preceding flip-flop 1002_(N-1); and the data-out stage circuit 210_N generates and outputs a data-out signal to the data output terminal QN, where a voltage level of the data-out signal is kept at a fixed voltage level (e.g., high voltage level or low voltage level) regardless of a voltage level of the test signal INTN obtained from the preceding flip-flop 1002_(N-1).

Figure 11:
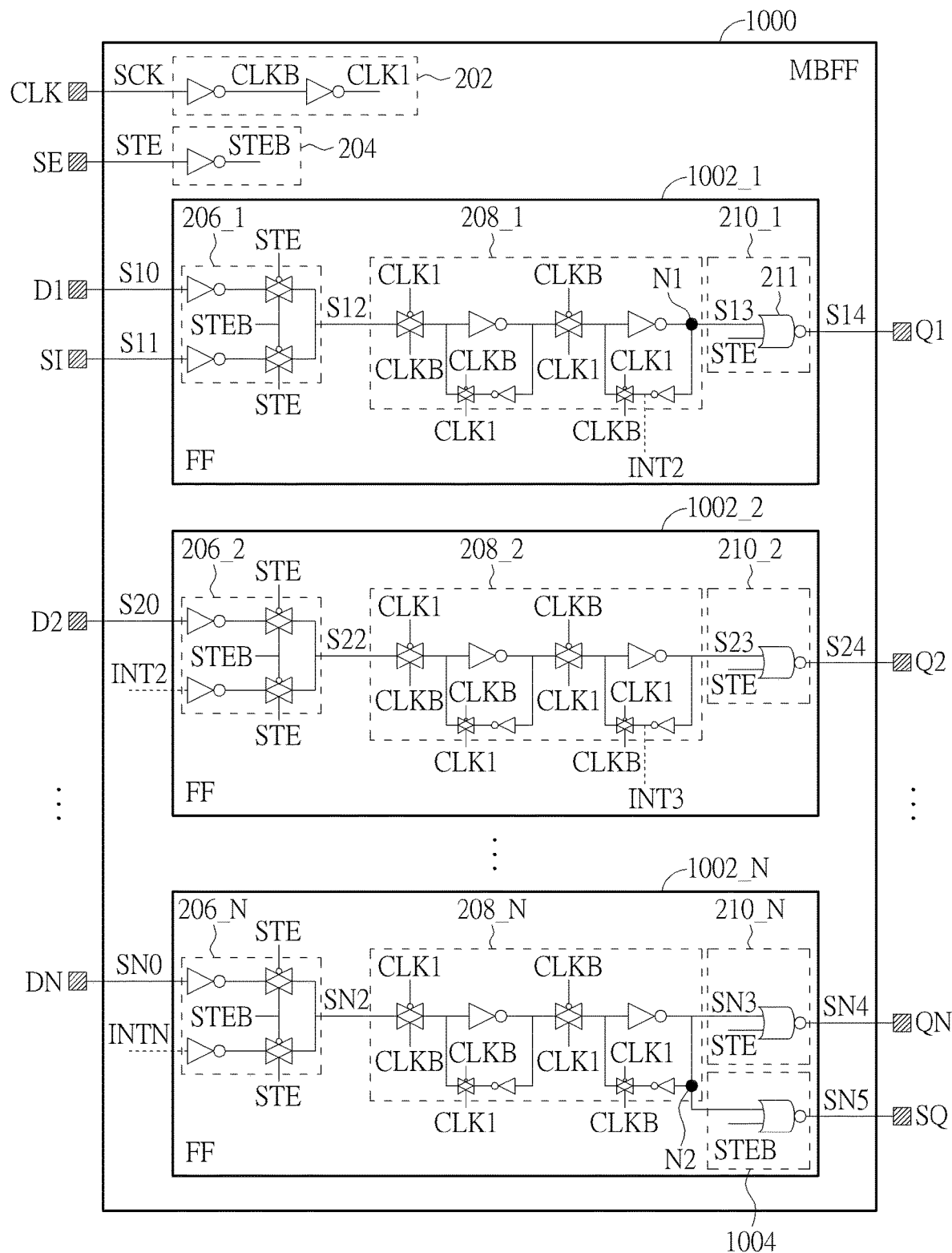
FIG. 11 is a diagram illustrating a third circuit design of an MBFF according to an embodiment of the present invention.

FIG. 11 is a diagram illustrating a third circuit design of an MBFF according to an embodiment of the present invention. By way of example, but not limitation, the MBFF 1000 shown in FIG. 10 may be implemented by using the circuit structure shown in FIG. 11. Each of the flip-flops 1002_1-1002_(N-1) may have the same circuit structure as illustrated in FIG. 2/FIG. 9. Further description is omitted for brevity. Regarding the last flip-flop 1002_N, it is arranged to output a data-out signal SN4 at the data output terminal QN of the MBFF 1000, and output a scan-out signal SN5 at the scan output terminal SQ of the MBFF 1000. The major difference between the flip-flops 802_N and 1002_N is that the flip-flop 1002_N employs the scan-out stage circuit 1004 with a gating function that is enabled in the normal mode of the MBFF 1000 and disabled in the test mode of the MBFF 1000. When the MBFF 1000 operates in the test mode, the selection circuit 206_N transmits the test signal INTN to the output node of the selection circuit 206_N to serve as the input signal SN2, and the scan-out stage circuit 1004 generates the scan-out signal SN5 having a voltage level that changes in response to a voltage level of the test signal INTN. Specifically, the voltage level of the scan-out signal SN5 changes in response to the voltage level of the signal SN3, where the voltage level of the signal SN3 changes in response to the voltage level of the test signal INTN. When the MBFF 1000 operates in the normal mode, the selection circuit 206_N transmits the data signal SN0 to the output node of the selection circuit 206_N to serve as the input signal SN2, and the scan-out stage circuit 1004 keeps the scan-out signal SN5 at a fixed voltage level (e.g., high voltage level or low voltage level) regardless of a voltage level of the data signal SN0. Specifically, the voltage level of the scan-out signal SN5 does not change in response to the voltage level of the signal SN3, while the voltage level of the signal SN3 changes in response to the voltage level of the data signal SN0.

Like the data-out stage circuits 210_1, 210_2 and 210_N, the scan-out stage circuit 1004 is implemented by a NOR gate, where one input node of the NOR gate is arranged to receive the signal SN3 at an output node N2 of the latch-based circuit 208_N, another input node of the NOR gate is arranged to receive the test-enable signal STEB, and an output node of the NOR gate is arranged to output the scan-out signal SN5 to the scan output terminal SQ of the MBFF 1000. Hence, when the MBFF 1000 operates in the normal mode (STEB=1), the gating function is enabled at the NOR gate; and when the MBFF 100 operates in the test mode (STEB=0), the gating function is disabled at the NOR gate.

The circuit structure shown in FIG. 11 is for illustrative purposes only, and is not meant to be a limitation of the present invention. For example, the selection circuit may be implemented by any other circuit structure which is capable of selecting one of a normal data input and a test data input as an input signal of a following latch-based circuit. For another example, the latch-based circuit may be implemented by any other circuit structure which is capable of processing an input signal obtained from a preceding selection circuit to generate and output a signal to a following data-out stage circuit with a gating function. For still another example, the data-out stage circuit with a gating function may be implemented by any other circuit structure which is capable of keeping a data-out signal at a fixed voltage level when an MBFF operates in a test mode. For still another example, the scan-out stage circuit with a gating function may be implemented by any other circuit structure which is capable of keeping a scan-out signal at a fixed voltage level when an MBFF operates in a normal mode.

Figure 12:
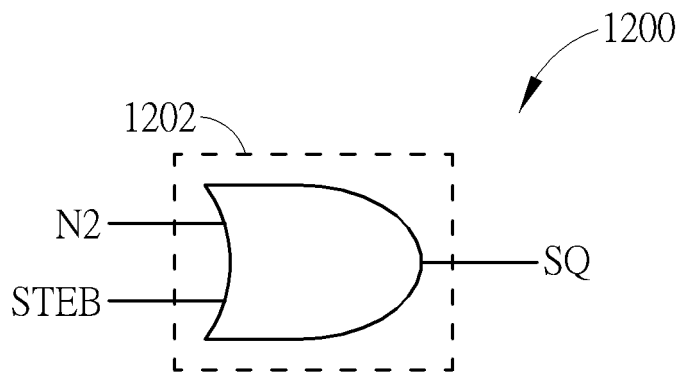
FIG. 12 is a diagram illustrating a first alternative design of a scan-out stage circuit with a gating function according to an embodiment of the present invention.

FIG. 12 is a diagram illustrating a first alternative design of a scan-out stage circuit with a gating function according to an embodiment of the present invention. For example, the scan-out stage circuit 1004 may be implemented by using the scan-out stage circuit 1200. The scan-out stage circuit 1200 employs an OR gate 1202, where one input node of the OR gate 1202 is coupled to an output node N2 of a preceding latch-based circuit, another input node of the OR gate 1202 is arranged to receive the test-enable signal STEB, and an output node of the OR gate 1202 is arranged to output a scan-out signal to the scan output terminal SQ of the MBFF 1000. When the MBFF 1000 operates in the test mode (STEB=0), a voltage level of the scan-out signal generated from the OR gate 1202 changes in response to a voltage of a signal at the output node N2 of the preceding latch-based circuit. When the MBFF 1000 operates in the normal mode (STEB=1), the scan-out signal generated from the OR gate 1202 is kept at a fixed voltage level (e.g., power supply voltage) regardless of the voltage of the signal at the output node N2 of the preceding latch-based circuit.

Figure 13:
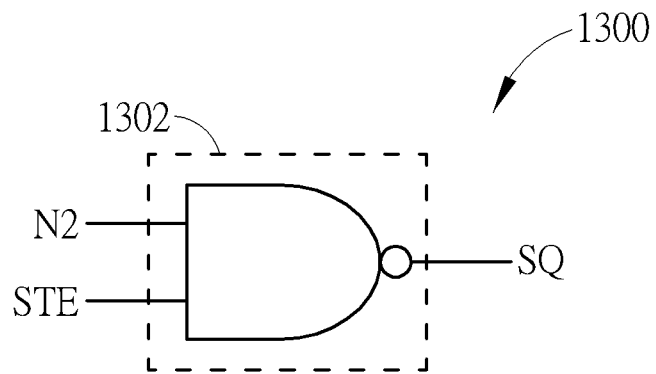
FIG. 13 is a diagram illustrating a second alternative design of a scan-out stage circuit with a gating function according to an embodiment of the present invention.

FIG. 13 is a diagram illustrating a second alternative design of a scan-out stage circuit with a gating function according to an embodiment of the present invention. For example, the scan-out stage circuit 1004 may be implemented by using the scan-out stage circuit 1300. The scan-out stage circuit 1300 employs a NAND gate 1302, where one input node of the NAND 1302 is coupled to an output node N2 of a preceding latch-based circuit, another input node of the NAND gate 1302 is arranged to receive the test-enable signal STE, and an output node of the NAND gate 1302 is arranged to output a scan-out signal to the scan output terminal SQ of the MBFF 1000. When the MBFF 1000 operates in the test mode (STE=1), a voltage level of the scan-out signal generated from the NAND gate 1302 changes in response to a voltage of a signal at the output node N2 of the preceding latch-based circuit. When the MBFF 1000 operates in the normal mode (STE=0), the scan-out signal generated from the NAND gate 1302 is kept at a fixed voltage level (e.g., power supply voltage) regardless of the voltage of the signal at the output node N2 of the preceding latch-based circuit.

Figure 14:
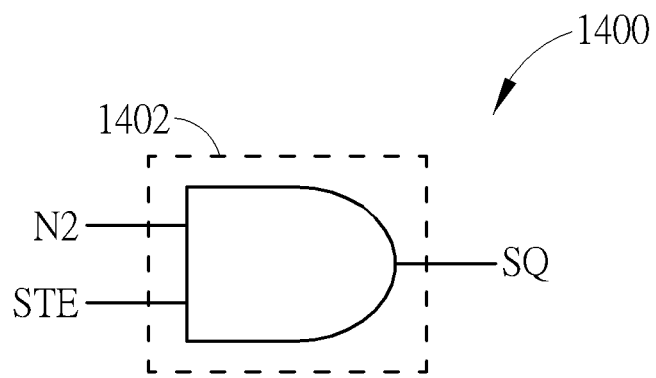
FIG. 14 is a diagram illustrating a third alternative design of a scan-out stage circuit with a gating function according to an embodiment of the present invention.

FIG. 14 is a diagram illustrating a third alternative design of a scan-out stage circuit with a gating function according to an embodiment of the present invention. For example, the scan-out stage circuit 1004 may be implemented by using the scan-out stage circuit 1400. The scan-out stage circuit 1400 employs an AND gate 1402, where one input node of the AND 1402 is coupled to an output node N2 of a preceding latch-based circuit, another input node of the AND gate 1402 is arranged to receive the test-enable signal STE, and an output node of the AND gate 1402 is arranged to output a scan-out signal to the scan output terminal SQ of the MBFF 1000. When the MBFF 1000 operates in the test mode (STE=1), a voltage level of the scan-out signal generated from the AND gate 1402 changes in response to a voltage of a signal at the output node N2 of the preceding latch-based circuit. When the MBFF 1000 operates in the normal mode (STE=0), the scan-out signal generated from the AND gate 1402 is kept at a fixed voltage level (e.g., ground voltage) regardless of the voltage of the signal at the output node N2 of the preceding latch-based circuit.

Figure 15:
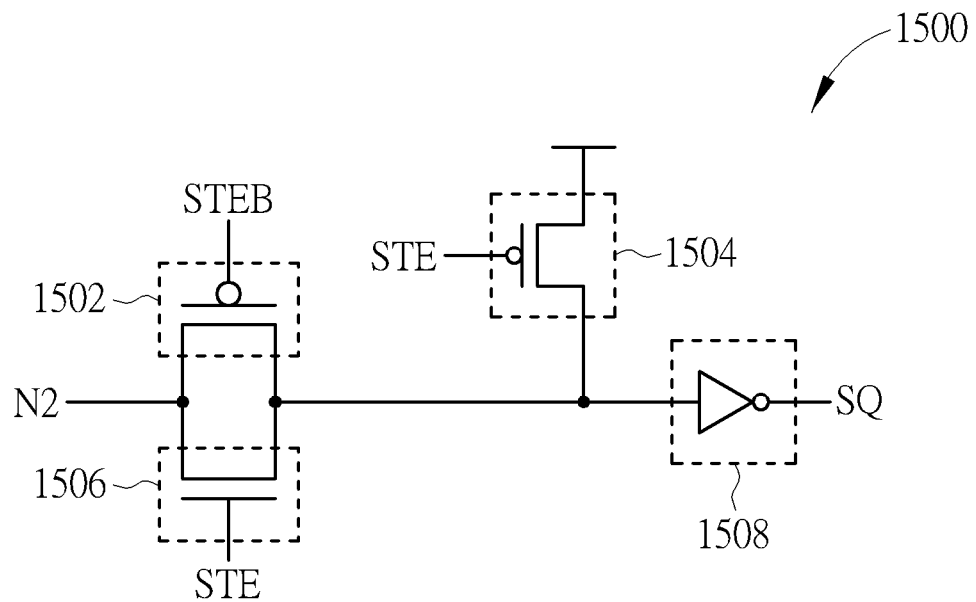
FIG. 15 is a diagram illustrating a fourth alternative design of a scan-out stage circuit with a gating function according to an embodiment of the present invention.

FIG. 15 is a diagram illustrating a fourth alternative design of a scan-out stage circuit with a gating function according to an embodiment of the present invention. For example, the scan-out stage circuit 1004 may be implemented by using the scan-out stage circuit 1500. The scan-out stage circuit 1500 includes PMOS transistors 1502 and 1504, an NMOS transistor 1506, and an inverter 1508. The gate electrode of the PMOS transistor 1504 receives the test-enable signal STE, the source electrode of the PMOS transistor 1504 is coupled to a reference voltage (e.g., power supply voltage), and the drain electrode of the PMOS transistor 1504 is coupled to an input node of the inverter 1508. The PMOS transistor 1502 and the NMOS transistor 1506 form a transmission gate. The gate electrode of the PMOS transistor 1502 receives the test-enable signal STEB, the source electrode of the PMOS transistor 1502 is coupled to an output node N2 of a preceding latch-based circuit, and the drain electrode of the PMOS transistor 1502 is coupled to the input node of the inverter 1508. The gate electrode of the NMOS transistor 1506 receives the test-enable signal STE, the drain electrode of the NMOS transistor 1506 is coupled to the output node N2 of the preceding latch-based circuit, and the source electrode of the NMOS transistor 1506 is coupled to the input node of the inverter 1508.

When the MBFF 1000 operates in the test mode (STE=1 & STEB=0), the transmission gate consisting of PMOS transistor 1502 and NMOS transistor 1506 is enabled, and the PMOS transistor 1504 is turned off, such that the voltage level of the scan-out signal at the scan output terminal SQ changes in response to the voltage level of the signal at the output node N2 of the preceding latch-based circuit. When the MBFF 1000 operates in the normal mode (STE=0 & STEB=1), the transmission gate consisting of PMOS transistor 1502 and NMOS transistor 1506 is disabled, and the PMOS transistor 1504 is turned on, such that the voltage level of the scan-out signal at the scan output terminal SQ is maintained at a fixed voltage level (e.g., ground voltage) regardless of the voltage level of the signal at the output node N2 of the preceding latch-based circuit.

Figure 16:
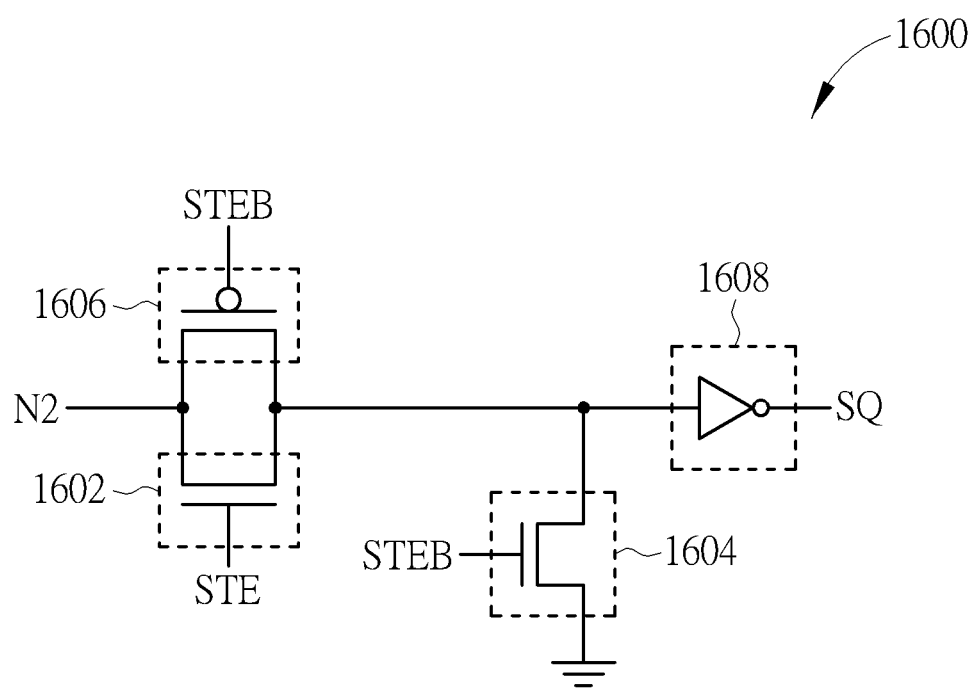
FIG. 16 is a diagram illustrating a fifth alternative design of a scan-out stage circuit with a gating function according to an embodiment of the present invention.

FIG. 16 is a diagram illustrating a fifth alternative design of a scan-out stage circuit with a gating function according to an embodiment of the present invention. For example, the scan-out stage circuit 1004 may be implemented by using the scan-out stage circuit 1600. The scan-out stage circuit 1600 includes NMOS transistors 1602 and 1604, a PMOS transistor 1606, and an inverter 1608. The gate electrode of the NMOS transistor 1604 receives the test-enable signal STEB, the source electrode of the NMOS transistor 1604 is coupled to a reference voltage (e.g., ground voltage), and the drain electrode of the NMOS transistor 1604 is coupled to an input node of the inverter 1608. The PMOS transistor 1606 and the NMOS transistor 1602 form a transmission gate. The gate electrode of the PMOS transistor 1606 receives the test-enable signal STEB, the source electrode of the PMOS transistor 1606 is coupled to an output node N2 of a preceding latch-based circuit, and the drain electrode of the PMOS transistor 1606 is coupled to the input node of the inverter 1608. The gate electrode of the NMOS transistor 1602 receives the test-enable signal STE, the drain electrode of the NMOS transistor 1602 is coupled to the output node N2 of the preceding latch-based circuit, and the source electrode of the NMOS transistor 1602 is coupled to the input node of the inverter 1608.

When the MBFF 1000 operates in the test mode (STE=1 & STEB=0), the transmission gate consisting of PMOS transistor 1606 and NMOS transistor 1602 is enabled, and the NMOS transistor 1604 is turned off, such that the voltage level of the scan-out signal at the scan output terminal SQ changes in response to the voltage level of the signal at the output node N2 of the preceding latch-based circuit. When the MBFF 1000 operates in the normal mode (STE=0 & STEB=1), the transmission gate consisting of PMOS transistor 1606 and NMOS transistor 1602 is disabled, and the NMOS transistor 1604 is turned on, such that the voltage level of the scan-out signal at the scan output terminal SQ is maintained at a fixed voltage level (e.g., power supply voltage) regardless of the voltage level of the signal at the output node N2 of the preceding latch-based circuit.

The MBFF 1000 with N flip-flops 1002_1-1002_N connected to form the internal scan chain 104 is designed to have a power saving feature. For example, when receiving an external test signal S11 at the scan input terminal SI, the MBFF 1000 passes the external test signal S11 through the internal scan chain 104, generates a scan-out signal SN5 that is output from the flip-flop 1002_N to the scan output terminal SQ and a voltage level thereof changes in response to a voltage level of the external test signal S11, and keeps each of N data-out signals (which are output from N flip-flops 1002_1-1002_N to N data output terminals Q1-QN, respectively) at a fixed voltage level regardless of a voltage level of the external test signal S11. Since N data-out signals have no signal level transition under the test mode of the MBFF 1000, the power consumption of the MBFF 1000 and the downstream combinational logics can be reduced.

Furthermore, when receiving a data signal SN0 at the data input terminal DN, the MBFF 1000 generates a data-out signal SN4 that is output from the flip-flop 1002_N to the data output terminal QN and a voltage level thereof changes in response to a voltage level of the data signal SN0, and keeps the scan-out signal SN5 (which is output from the flip-flop 1002_N to the scan output terminal SQ) at a fixed voltage level regardless of a voltage level of the data signal SN0. Since the scan-out signal have no signal level transition under the normal mode of the MBFF 1000, the power consumption of the MBFF 1000 and the downstream logic can be reduced.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A multi-bit flip-flop (MBFF) comprising:
   a plurality of flip-flops, connected to form an internal scan chain, wherein the plurality of flip-flops comprise:
      a first flip-flop, arranged to output a first data-out signal at a first data output terminal of the MBFF, wherein the first flip-flop comprises:
         a first selection circuit, arranged to transmit a first data signal at a first data input terminal of the MBFF or a first test signal to an output node of the first selection circuit to serve as a first input signal;
         a first latch-based circuit, coupled to the output node of the first selection circuit and arranged to generate a first signal according to the first input signal; and
         a first data-out stage circuit, arranged to receive the first signal, and generate the first data-out signal according to the first signal; and
      a signal generation circuit, arranged to receive a first test-enable signal at a test-enable terminal of the MBFF, and generate and output a second test-enable signal, wherein the second test-enable signal is an inverse of the first test-enable received at the test-enable terminal;
   wherein when the MBFF operates in a test mode, the first selection circuit is arranged to transmit the first test signal to the output node of the first selection circuit to serve as the first input signal, and the first data-out stage circuit is arranged to keep the first data-out signal at a fixed voltage level regardless of a voltage level of the first test signal; and
   wherein the first data-out stage circuit is further arranged to receive both of the first test-enable signal and the second test-enable signal, and is jointly controlled by the first test-enable signal and the second test-enable signal to generate the first data-out signal according to the first signal.

2. The MBFF of claim 1, wherein the first data-out stage circuit comprises:
   a transmission gate, comprising:
      a first transistor, having a first electrode coupled to an output node of the first latch-based circuit, and a control electrode arranged to receive the first test-enable signal; and
      a second transistor, having a first electrode coupled to the output node of the first latch-based circuit, and a control electrode arranged to receive the second test-enable signal; and
      a third transistor, having a first electrode coupled to a reference voltage, a second electrode coupled to second electrodes of the first transistor and the second transistor, and a control electrode arranged to receive one of the first test-enable signal and the second test-enable signal, wherein the first data-out signal depends on a voltage level at the second electrode of the third transistor.

3. The MBFF of claim 1, wherein the first test signal is an external test signal received at a scan input terminal of the MBFF.

4. The MBFF of claim 1, wherein the plurality of flip-flops further comprise:
   a second flip-flop, arranged to output a second data-out signal at a second data output terminal of the MBFF, wherein the second flip-flop comprises:

a second selection circuit, arranged to transmit a second data signal at a second data input terminal of the MBFF or a second test signal to an output node of the second selection circuit to serve as a second input signal;

a second latch-based circuit, coupled to the output node of the second selection circuit and arranged to generate the first test signal and a second signal according to the second input signal; and a second data-out stage circuit, arranged to receive the second signal, and generate the second data-out signal according to the second signal.

5. The MBFF of claim 4, wherein when the MBFF operates in the test mode, the second selection circuit is arranged to transmit the second test signal to the output node of the second selection circuit to serve as the second input signal, and the second data-out stage circuit is arranged to keep the second data-out signal at a fixed voltage level regardless of a voltage level of the second test signal.

6. The MBFF of claim 5, wherein the second data-out stage circuit is further arranged to receive the first test-enable signal at the test-enable terminal of the MBFF, and is controlled by the first test-enable signal to generate the second data-out signal according to the second signal.

7. The MBFF of claim 5, wherein the second data-out stage circuit is further arranged to receive the second test-enable signal that is the inverse of the first test-enable signal at the test-enable terminal of the MBFF, and is controlled by the second test-enable signal to generate the second data-out signal according to the second signal.

8. The MBFF of claim 5, wherein the second data-out stage circuit is further arranged to receive the first test-enable signal at the test-enable terminal of the MBFF and the second test-enable signal that is the inverse of the first test-enable signal, and is controlled by the first test-enable signal and the second test-enable signal to generate the second data-out signal according to the second signal.

9. The MBFF of claim 1, wherein the first latch-based circuit is further arranged to generate a second test signal according to the first input signal, and the plurality of flip-flops further comprise:

a second flip-flop, arranged to output a second data-out signal at a second data output terminal of the MBFF, wherein the second flip-flop comprises:

a second selection circuit, arranged to transmit a second data signal at a second data input terminal of the MBFF or the second test signal obtained from the first latch-based circuit to an output node of the second selection circuit to serve as a second input signal;

a second latch-based circuit, coupled to the output node of the second selection circuit and arranged to generate a second signal according to the second input signal; and a second data-out stage circuit, arranged to receive the second signal, and generate the second data-out signal according to the second signal.

10. The MBFF of claim 1, wherein the first flip-flop is further arranged to output a scan-out signal at a scan output terminal of the MBFF, and further comprises:

a scan-out stage circuit, arranged to receive the first signal, and generate the scan-out signal according to the first signal, wherein when the MBFF operates in the test mode, the scan-out stage circuit is arranged to generate the scan-out signal having a voltage level that changes in response to a voltage level of the first test signal.

11. The MBFF of claim 10, wherein when the MBFF operates in a normal mode, the first selection circuit is arranged to transmit the first data signal to the output node of the first selection circuit to serve as the first input signal, and the scan-out stage circuit is arranged to keep the scan-out signal at a fixed voltage level regardless of a voltage level of the first data signal.

12. The MBFF of claim 11, wherein the scan-out stage circuit is further arranged to receive the first test-enable signal at the test-enable terminal of the MBFF, and is controlled by the first test-enable signal to generate the scan-out signal according to the first signal.

13. The MBFF of claim 11, wherein the scan-out stage circuit is further arranged to receive the second test-enable signal that is the inverse of the first test-enable signal at the test-enable terminal of the MBFF, and is controlled by the second test-enable signal to generate the scan-out signal according to the first signal.

14. The MBFF of claim 11, wherein the scan-out stage circuit is further arranged to receive the first test-enable signal at the test-enable terminal of the MBFF and the second test-enable signal that is the inverse of the first test-enable signal, and is controlled by the first test-enable signal and the second test-enable signal to generate the scan-out signal according to the first signal.

15. A control method applied to a multi-bit flip-flop (MBFF) having N flip-flops connected to form an internal scan chain, wherein the MBFF comprises only a single scan input terminal coupled to one of the N flip-flops, and N data output terminals coupled to the N flip-flops, respectively, where N is a positive integer not smaller than one; the control method comprising:

receiving a first test-enable signal at a test-enable terminal of the MBFF, and generating and outputting a second test-enable signal, wherein the second test-enable signal is an inverse of the first test-enable received at the test-enable terminal; and in response to receiving an external test signal at the single scan input terminal of the MBFF, passing the external test signal through the internal scan chain;

generating a scan-out signal with a voltage level that changes in response to a voltage level of the external test signal, wherein the scan-out signal is output from one of the N flip-flops to one of the N data output terminals; and keeping each of (N-1) data-out signals at a fixed voltage level regardless of a voltage level of the external test signal, wherein the (N-1) data-out signals are output from remaining (N-1) flip-flops of the N flip-flops to remaining (N-1) output terminals of the N data output terminals, respectively;

wherein keeping said each of the (N-1) data-out signals at the fixed voltage level regardless of the voltage level of the external test signal comprises:

receiving both of the first test-enable signal and the second test-enable signal; and using the first test-enable signal and the second test-enable signal to jointly control a voltage level of at least one of the (N-1) data-out signals.

16. A control method applied to a multi-bit flip-flop (MBFF) having N flip-flops connected to form an internal scan chain, wherein the MBFF comprises only a single scan input terminal coupled to one of the N flip-flops, only a single scan output terminal coupled to another of the N flip-flops, and N data output terminals coupled to the N flip-flops, respectively, where N is a positive integer not smaller than one; the control method comprising:

receiving a first test-enable signal at a test-enable terminal of the MBFF, and generating and outputting a second test-enable signal, wherein the second test-enable signal is an inverse of the first test-enable received at the test-enable terminal; and in response to receiving an external test signal at the single scan input terminal of the MBFF, passing the external test signal through the internal scan chain;

generating a scan-out signal with a voltage level that changes in response to a voltage level of the external test signal, wherein the scan-out signal is output from said another of the N flip-flops to the single scan output terminal; and keeping each of N data-out signals at a fixed voltage level regardless of a voltage level of the external test signal, wherein the N data-out signals are output from the N flip-flops to the N data output terminals of the MBFF, respectively;

wherein keeping said each of the N data-out signals at the fixed voltage level regardless of the voltage level of the external test signal comprises:

receiving both of the first test-enable signal and the second test-enable signal; and using the first test-enable signal and the second test-enable signal to jointly control a voltage level of at least one of the N data-out signals.

17. The control method of claim 16, wherein the MBFF further comprises N data input terminals coupled to the N flip-flops, respectively; and the control method further comprises:

in response to receiving a data signal at a data input terminal coupled to said another of the N flip-flops, keeping the scan-out signal at a fixed voltage level regardless of a voltage level of the data signal.

* * * * *